United States Patent [19]

Okumura et al.

[11] Patent Number: 4,701,620
[45] Date of Patent: Oct. 20, 1987

[54] ELECTRON BEAM EXPOSURE APPARATUS

[75] Inventors: Masahide Okumura, Sagamihara; Takashi Matsuzaka, Kokubunji; Genya Matsuoka, Ome; Norio Saitou, Iruma, all of Japan

[73] Assignee: Hitachi, Ltd., Tokyo, Japan

[21] Appl. No.: 893,180

[22] Filed: Aug. 5, 1986

[30] Foreign Application Priority Data

Aug. 22, 1985 [JP] Japan ................................ 60-183078

[51] Int. Cl.$^4$ ........................ G21K 1/093; H01J 37/07
[52] U.S. Cl. .................... 250/398; 250/492.2; 250/396 ML; 250/397
[58] Field of Search ............. 250/398, 492.2, 396 ML, 250/397

[56] References Cited

U.S. PATENT DOCUMENTS 4,125,772 11/1978 Holmes ........................ 250/396 ML
4,544,846 10/1985 Langaer et al. ............. 250/396 ML

FOREIGN PATENT DOCUMENTS 140820 7/1983 Japan ................................ 250/492.2

Primary Examiner—Carolyn E. Fields
Assistant Examiner—John A. Miller
Attorney, Agent, or Firm—Antonelli, Terry & Wands

[57] ABSTRACT

Disclosed is an electron beam exposure apparatus which includes an objective lens focusing an electron beam, and a dynamic focus correction lens dynamically correcting the focusing by the objective lens. The apparatus comprises a control circuit which, in order to prevent a current variation induced in the objective lens by the dynamic focus correction lens, controls current supplied to the objective lens so as to cancel the current variation induced in the objective lens due to the coil current of the dynamic focus correction lens.

3 Claims, 7 Drawing Figures

→ TIME

ELECTRON BEAM EXPOSURE APPARATUS

BACKGROUND OF THE INVENTION

This invention relates to an electron beam exposure apparatus which scans a semiconductor wafer or the like with an electron beam for the purpose of pattern-writing, and more particularly to an apparatus of the kind described above in which dynamic focus correction can be easily carried out.

An electron beam exposure apparatus directs an electron beam toward and onto a workpiece such as a semiconductor wafer to write a desired pattern on the workpiece, and, in such an apparatus, an objective lens is disposed in the path of the electron beam to finely focus the electron beam thereby exposing the workpiece to the finely focused electron beam.

In the electron beam exposure apparatus, the period of time required until, after a semiconductor wafer set on a workpiece stage is exposed to an electron beam carrying a predetermined pattern and is then taken out, the next wafer is re-set on the workpiece stage, that is, the so-called throughput should be as short as possible. As means for improving the throughput, it has recently been attempted to widen a deflection field of the electron beam on a wafer so as to reduce the frequency of movement of the workpiece stage. However, an increase in the amount of deflection of the electron beam results in an increased degree of beam de-focus in proportion to the second power of the distance from the center to the position of deflection, and it becomes necessary to correct this beam de-focus.

The beam de-focus can be corrected by disposing a dynamic focus correction lens in the path of the electron beam and controlling the dynamic focus correction lens according to the position of deflection. Actually, however, a magnetic field produced by the dynamic focus correction lens intrudes partly into the magnetic path of the objective lens to cause such a disturbance that a constant magnetic field established by the objective lens changes gradually with time. As a result of the disturbance, such a new problem arises that the position of the deflected electron beam changes with time thereby degrading the positioning accuracy for the electron beam.

JP-A-60-140820 (Japanese Patent Un-examined Publication filed on July 25, 1985 assigned to HITACHI Ltd.,) discloses a method which corrects the beam de-focus due to the deflection of the electron beam and which can minimize degradation of the positioning accuracy for the electron beam as a result of the focus correction. JP-A-60-140820 teaches that, by selecting the diameter of the dynamic focus correction lens to be smaller than ½ of the inner diameter of the magnetic path, the undesirable disturbance by the magnetic field of the dynamic focus correction lens on the constant magnetic field of the objective lens can be reduced to less than ⅛ of the prior art value. However, it has been difficult with such a method to control position deviation of the electron beam to within the required range of accuracy. Therefore, in order to maintain the required accuracy, it has been necessary to wait the exposure for several ms which is the period of time required until the disturbance completely disappears, and it has been unable to expect a remarkable improvement of the throughput. For example, waiting for 5 ms at each time of beam deflection corresponds to a total waiting time of about 1 hour in the case of a 4-inch wafer.

SUMMARY OF THE INVENTION

It is a primary object of the present invention to provide an electron beam exposure apparatus in which the unnecessary magnetic field produced by the dynamic focus correction lens is cancelled to substantially eliminate the exposure waiting time thereby improving the throughput.

In accordance with the present invention which attains the above object, there is provided an electron beam exposure apparatus comprising means for emitting an electron beam, an objective lens focusing the electron beam, a dynamic focus correction lens dynamically correcting the focusing by the objective lens, and a control circuit controlling current supplied to the objective lens so as to cancel a current variation induced in the objective lens due to coil current of the dynamic focus correction lens. According to an embodiment of the present invention, coil current of the dynamic focus correction lens is detected so as to control the current supplied to the objective lens on the basis of the detected coil current value. According to another embodiment of the present invention, a detecting coil is provided to detect the magnetic field variation of the objective lens due to the dynamic focus correction so as to control the current supplied to the objective lens on the basis of the detection output signal appearing from the detecting coil.

DESCRIPTION OF THE PREFERRED EMBODIMENTS

Figure 1:
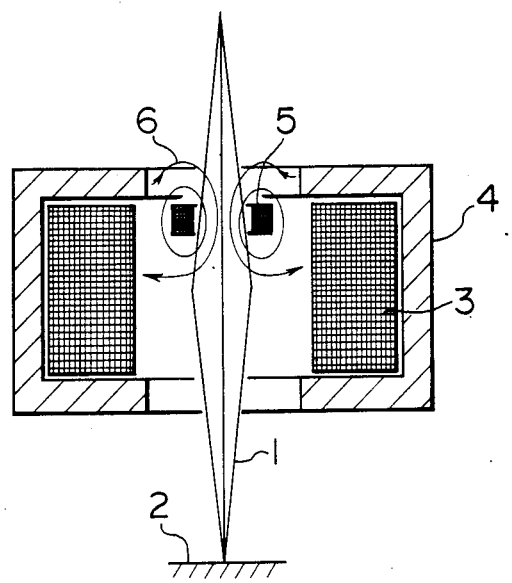
FIG. 1 is a schematic sectional view of parts including an objective lens and a dynamic focus correction lens.
Figure 2A:
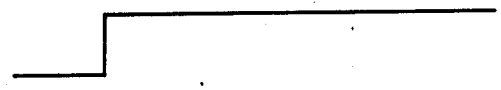
FIG. 2A is a waveform diagram showing a change of a focus-correction magnetic field produced by the dynamic focus correction lens.
Figure 2B:
FIG. 2B is a waveform diagram showing a change of a magnetic field produced by the objective lens.
Figure 2C:
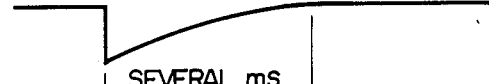
FIG. 2C is a waveform diagram showing a required magnetic field for correcting the change shown in FIG. 2B.
Figure 2D:
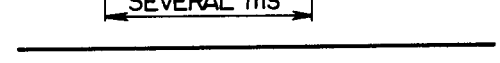
FIG. 2D is a waveform diagram showing a corrected magnetic field of the objective lens.

First, an example of the positional relation between an objective lens and a dynamic focus correction lens will be described with reference to FIG. 1. The value of current supplied to the objective lens 3 is set so that, when an electron beam 1 passes the center of deflection, the electron beam 1 is in sharp focus on a surface of a semiconductor wafer 2. When the electron beam 1 is deflected, current supplied to the dynamic focus correction lens 5 is controlled according to the amount of beam deflection, and the dynamic focus correction lens 5 produces a focus-correction magnetic field 6 so as to ensure optimized focusing of the electron beam 1 on the surface of the wafer 2. However, as shown in FIG. 1, a portion of the focus-correction magnetic field 6 intrudes into a magnetic path 4 of the objective lens 3 and tends to change the current of the objective lens 3. Since the objective lens 3 is supplied from a constant current source, it acts naturally to suppress such a disturbance. However, because of the fact that the objective lens 3 has structurally a large inductance, and the time constant is long or several ms, the constant magnetic field established by the objective lens 3 changes generally exponentially during the above period of time. That is, an undesirable position deviation of the electron beam 1 results. FIGS. 2A to 2D illustrate those relations. FIG. 2A illustrates a change of the focus-correction magnetic field 6 produced by the dynamic focus correction lens 5, and the waveform shown in FIG. 2B indicates a change of the affected magnetic field of the objective lens 3. It will be apparent from the figures that, when a waveform as shown in FIG. 2C, which waveform is a polarity-inverted equivalent of the waveform shown in FIG. 2B, is produced and superposed on the waveform of the magnetic field of the objective lens 3 shown in FIG. 2B, a corrected waveform of the magnetic field of the objective lens 3, as shown in FIG. 2D, is obtained.

Thus, the present invention provides an electron beam exposure apparatus comprising an objective lens focusing an electron beam, a dynamic focus correction lens dynamically correcting the focusing by the objective lens, and a control circuit controlling current supplied to the objective lens so as to cancell a current variation induced in the objective lens due to coil current of the dynamic focus correction lens, whereby the exposure waiting time is substantially eliminated to improve the throughput.

Preferred embodiments of the present invention will now be described with reference to the drawings.

Figure 3:
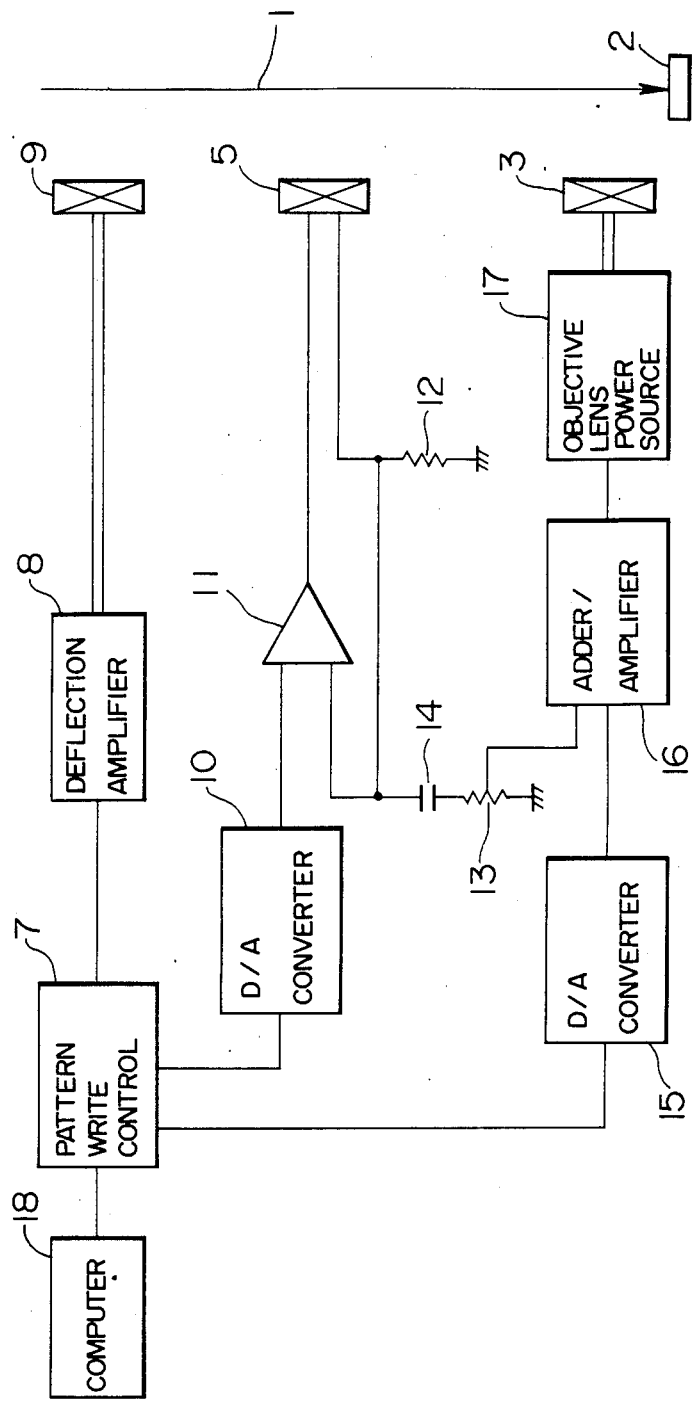
FIG. 3 is a block diagram showing the structure of an embodiment of the electron beam exposure apparatus according to the present invention.

FIG. 3 is a block diagram showing the structure of an embodiment of the electron beam exposure apparatus according to the present invention. In order to effectively practice the present invention, how to produce the waveform shown in FIG. 2C is the primary requirement, and the embodiment shown in FIG. 3 is constructed to indirectly produce the waveform shown in FIG. 2C. Referring to FIG. 3, a deflection amplifier 8 and a deflection coil 9 constitute part of a function of deflecting an electron beam 1, and a computer 18 controls pattern writing together with a pattern-writing control part 7. A circuit part composed by a digital-analog converter 15, an adder/amplifier 16, an objective-lens power source 17 and an objective lens coil 3 acts to focus the electron beam 1 on a surface of a semiconductor wafer 2 when the electron beam 1 passes the center of deflection. Another circuit part composed by another digital-analog converter 10, an operational amplifier 11 and a current detecting resistor 12 controls a dynamic focus correction coil 5 dynamically correcting the focus according to the amount of deflection of the electron beam 1. A differentiation circuit composed by a variable resistor 13 and a capacitor 14 differentiates a voltage variation across the current detecting resistor 12 of the dynamic focus correction circuit part and is connected to the input of the adder/amplifier 16.

In operation, conditions necessary for pattern writing are set in the pattern-writing control part 7 from the computer 18. The electron beam 1 is deflected by the deflection coil 9 to which current is supplied from the pattern-writing control part 7 through the deflection amplifier 8. On the other hand, data instructing conditions for focusing the electron beam 1 at the center of deflection are set in the digital-analog converter 15 from the pattern-writing control part 7. As a result, a predetermined current is supplied to the objective lens coil 3 through the adder/amplifier 16 and objective-lens power source 17. Further, data for correcting de-focus of the deflected electron beam 1 are set in the digital-analog converter 10 from the pattern-writing control part 7. The output of the digital-analog converter 10 provides a reference voltage of the operational amplifier 11 having the dynamic focus correction coil 5 in its negative feedback loop, so that the operational amplifier 11 controls the current of the dynamic focus correction lens 5 together with the current detecting resistor 12.

A voltage corresponding to a variation of the current supplied to the dynamic focus correction coil 5 appears across the current detecting resistor 12 and is differentiated by the differentiation circuit composed by the resistor 13 and capacitor 14. The differentiated waveform can be made generally equal to the waveform shown in FIG. 2B by suitably adjusting the differentiation time constant. The differentiated waveform is applied to the adder/amplifier 16 so that finally the waveform of the current supplied to the objective lens coil 3 changes as shown in FIG. 2C. Suppose that the differentiation circuit composed by the resistor 13 and capacitor 14 is not present. In such a case, the waveform of the current supplied to the objective lens coil 3 changes as shown in FIG. 2B. Therefore, when the differentiated waveform having the amplitude and time constant adjusted as described above is added to the waveform shown in FIG. 2B, these waveforms cancel each other, and no change occurs on the current supplied to the objective lens coil 3. That is, even when the current supplied to the dynamic focus correction lens 5 may change, the constant magnetic field produced by the objective lens coil 3 is not disturbed, and the exposure positioning accuracy is not adversely affected.

Figure 4:
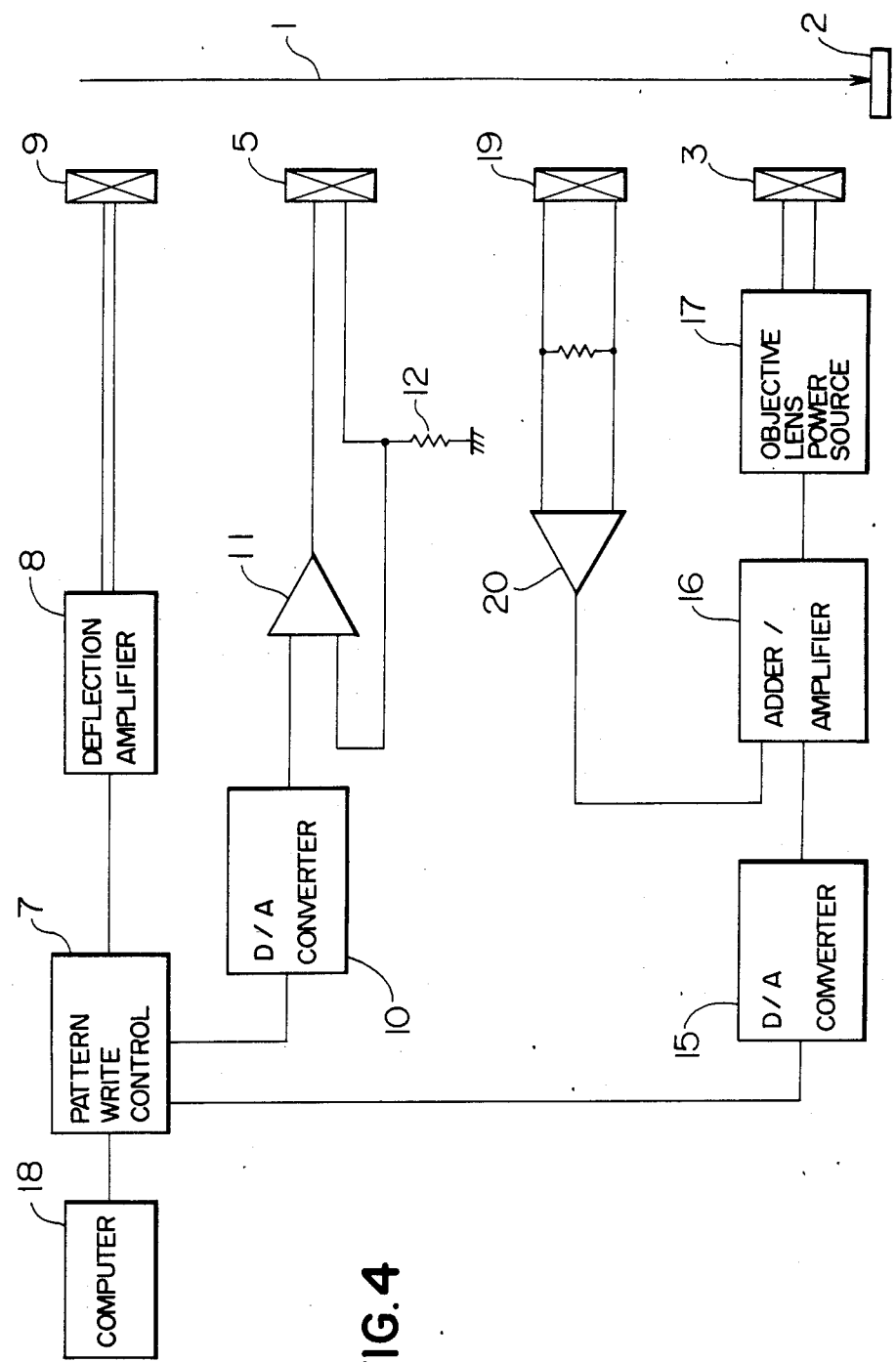
FIG. 4 is a block diagram showing the structure of another embodiment of the present invention.

FIG. 4 is a block diagram showing the structure of another embodiment in which a variation of a magnetic field of an objective lens coil 3 is directly detected to produce a correcting waveform signal. In FIG. 4, the reference numeral 19 designates a detecting coil disposed in the vicinity of the objective lens coil 3, and 20 designates an amplifier which amplifies the detection output signal of the detecting coil 19 up to a required level. Other circuit parts are the same as those shown in FIG. 3, and description of such parts will be unnecessary.

In operation, a variation of coil current of the dynamic focus correction coil 5 causes a corresponding variation of the magnetic field produced by the objective lens coil 3. It is apparent that a current having a waveform as shown in FIG. 2B is induced in the detecting coil 19. Therefore, the polarity and gain of the amplifier 20 are suitably adjusted so that the current supplied to the objective lens coil 3 may not change.

It will be understood from the foregoing description that the present invention provides an electron beam exposure apparatus comprising an objective lens focusing an electron beam, a dynamic focus correction lens dynamically correcting the focusing by the objective lens, and a control circuit controlling current supplied to the objective lens so as to cancell a current variation induced in the objective lens due to coil current of the dynamic focus correction lens, so that the adverse effect of disturbance on the objective lens can be prevented under the change of the coil current of the dynamic focus correction lens according to the amount of electron beam deflection. Therefore, unlike the prior art apparatus, it is unnecessary to wait the exposure for a period of time (several ms) required until the disturbance on the constant magnetic field of the objective lens completely disappears, and the throughput can be shortened. Also, the dynamic focus correction can also be effectively achieved even when the electron beam is deflected over a wide area of, for example, 6 mm².

We claim:

1. An electron beam exposure apparatus comprising means for emitting an electron beam, an objective lens focusing the electron beam, a dynamic focus correction lens, located within said objective lens which dynamically corrects the focusing by said objective lens, and control means for controlling current supplied to said objective lens so as to cancel a current variation induced in said objective lens due to coil current of said dynamic focus correction lens.

2. An electron beam exposure apparatus as claimed in claim 1, wherein said control means includes current detecting means for detecting the coil current of said dynamic focus correction lens, and said control means controlling the current supplied to said objective lens on the basis of the current value detected by said current detecting means.

3. An electron beam exposure apparatus as claimed in claim 1, wherein said control means includes a detecting coil detecting a variation of the intensity of the magnetic field of said objective lens, and said control means controlling the current supplied to said objective lens on the basis of the detection output signal appearing from said detecting coil.

* * * * *